United States Patent
Bapat et al.

(10) Patent No.: US 7,469,371 B1
(45) Date of Patent: Dec. 23, 2008

(54) METHODS OF TESTING A USER DESIGN IN A PROGRAMMABLE INTEGRATED CIRCUIT

(75) Inventors: Shekhar Bapat, Cupertino, CA (US); Mohit Kumar Jain, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 366 days.

(21) Appl. No.: 11/500,526

(22) Filed: Aug. 8, 2006

(51) Int. Cl.
   *G01R 31/28* (2006.01)
(52) U.S. Cl. .......................... 714/725; 326/38
(58) Field of Classification Search ............. 716/16, 716/18; 714/724, 725; 326/41, 38; 713/189
   See application file for complete search history.

(56) References Cited

U.S. PATENT DOCUMENTS

| | | | |
|---|---|---|---|
| 6,651,238 B1 * | 11/2003 | Wells et al. ............. | 716/16 |
| 6,664,808 B2 | 12/2003 | Ling et al. | |
| 6,817,006 B1 | 11/2004 | Wells et al. | |
| 6,891,395 B2 | 5/2005 | Wells et al. | |
| 6,944,809 B2 * | 9/2005 | Lai et al. ............... | 714/725 |
| 7,007,250 B1 | 2/2006 | Bapat et al. | |
| 7,015,719 B1 * | 3/2006 | Feng et al. ............. | 326/41 |
| 7,111,213 B1 * | 9/2006 | Dastidar et al. ........ | 714/724 |
| 7,143,295 B1 * | 11/2006 | Trimberger ............ | 713/189 |
| 2004/0216081 A1 * | 10/2004 | Wells et al. ............ | 716/18 |

OTHER PUBLICATIONS

U.S. Appl. No. 10/631,461, filed Jul. 30, 2003, Wells et al.
U.S. Appl. No. 10/815,483, filed Apr. 1, 2004, Trimberger et al.
U.S. Appl. No. 10/970,936, filed Oct. 22, 2004, Wells et al.

* cited by examiner

*Primary Examiner*—David Ton
(74) *Attorney, Agent, or Firm*—Lois D. Cartier

(57) ABSTRACT

Methods of testing a user design implemented in a programmable integrated circuit (IC). The programmable IC is programmed with a first test design that includes the user design and a first test circuit, and a first test pattern is run. The programmable IC is then programmed with a second test design that includes the user design and a second test circuit, and a second test pattern is run. If one of the test patterns fails and the other passes, the programmable IC passes the test sequence. Because one of the test patterns passed, the error in the other test pattern must have occurred in the test circuit, which is not necessary for the functioning of the user design in the programmable IC. Thus, the success of one test pattern shows that the flawed resource is not included in the portion of the programmable IC utilized for implementing the user design.

12 Claims, 5 Drawing Sheets

US 7,469,371 B1

METHODS OF TESTING A USER DESIGN IN A PROGRAMMABLE INTEGRATED CIRCUIT

FIELD OF THE INVENTION

The invention relates to programmable integrated circuits (ICs). More particularly, the invention relates to methods of testing a user design implemented in a programmable IC.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

The term "programmable IC" includes but is not limited to these exemplary devices, as well as encompassing devices that are only partially programmable. For example, one type of programmable IC includes a combination of hard-coded transistor logic and a programmable switch fabric that programmably interconnects the hard-coded transistor logic.

A known method of reducing test time for programmable ICs is to sell a programmable IC that is targeted to a particular user design. In other words, only the resources used by the particular user design are tested and guaranteed to function properly in the specific programmable IC. Because tester time is a significant contributor to the overall cost of a programmable IC, testing only those resources used by a particular user design can significantly reduce the cost of the programmable IC.

Additionally, the yield of the programmable IC product may be increased, because programmable ICs having minor manufacturing defects can potentially still be sold. As long as the particular user design targeted for the specific programmable IC does not use the defective resource(s), the programmable IC can still be used for that particular user design.

The better the quality of testing for a programmable IC/user design combination (e.g., the more accurately the testing can determine acceptable programmable IC/user design combinations), the better the yield on the programmable IC product. Hence, it is desirable to improve the quality of testing for device/design combinations, where the user design uses some but not all of the resources in the programmable IC.

SUMMARY OF THE INVENTION

The invention provides methods of testing a user design implemented in a specific programmable integrated circuit (IC), i.e., testing a particular user design in a specific programmable IC to determine whether or not the programmable IC can be used to implement that design. The programmable IC is programmed with a first test design that includes the user design and a first test circuit (e.g., a test interface), and a first test pattern is run. The programmable IC is then programmed with a second test design that includes the user design and a second test circuit, and a second test pattern is run. If one of the two test patterns fails but the other test pattern passes, the programmable IC passes the test sequence. Because one of the test patterns passed, the error in the other test pattern must have occurred in the test circuit, which is not necessary for the functioning of the user design in the programmable IC. Thus, the success of one test pattern shows that the flawed resource is not included in the portion of the programmable IC utilized for implementing the user design.

BRIEF DESCRIPTION OF THE DRAWINGS

The present invention is illustrated by way of example, and not by way of limitation, in the following figures.

DETAILED DESCRIPTION OF THE DRAWINGS

The present invention is applicable to a variety of programmable integrated circuits (ICs). An appreciation of the present invention is presented by way of specific examples utilizing programmable logic devices (PLDs) such as field programmable gate arrays (FPGAs). However, the present invention is not limited by these examples, and can be applied to virtually any IC that includes reprogrammable resources.

Figure 1:
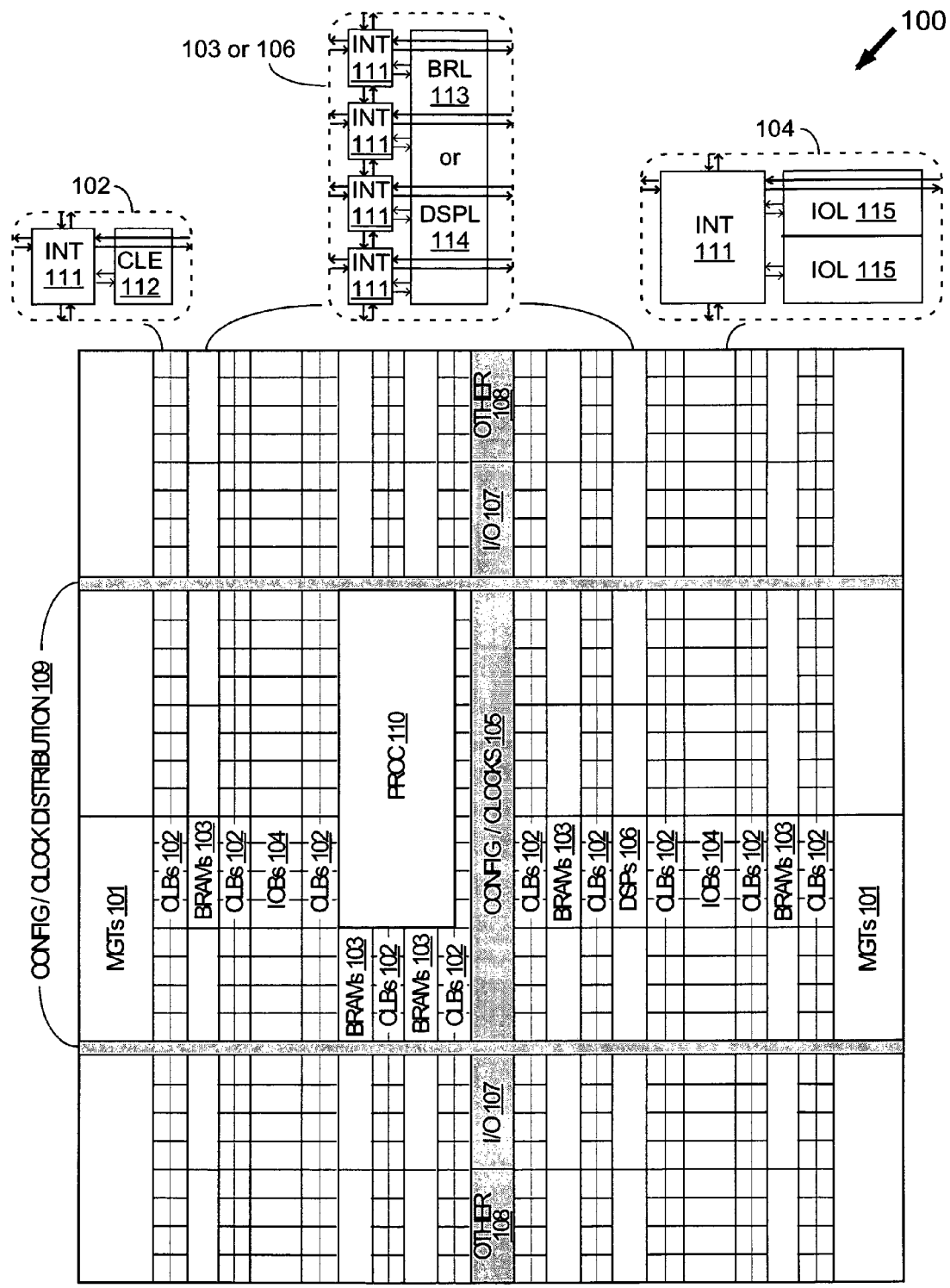
FIG. 1 is a block diagram of an exemplary field programmable gate array (FPGA).

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 2 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Many user designs use only a subset of the programmable resources included in an FPGA. For example, a user design typically does not use all of the CLBs in an FPGA, or all of the IOBs, and so forth. In most cases, a user will attempt to utilize a large percentage of the available resources, e.g., by buying the smallest FPGA in which his or her design can be implemented. Nevertheless, some of the programmable resources typically go unused. These used resources can be used in the testing process for the user design.

As described in the "Background" section, above, one approach to reducing costs for programmable IC users is to sell programmable ICs targeted to a particular user design. When this approach is used, the programmable IC is tested in conjunction with the particular user design, but might or might not be tested in conjunction with other designs.

Figure 2:
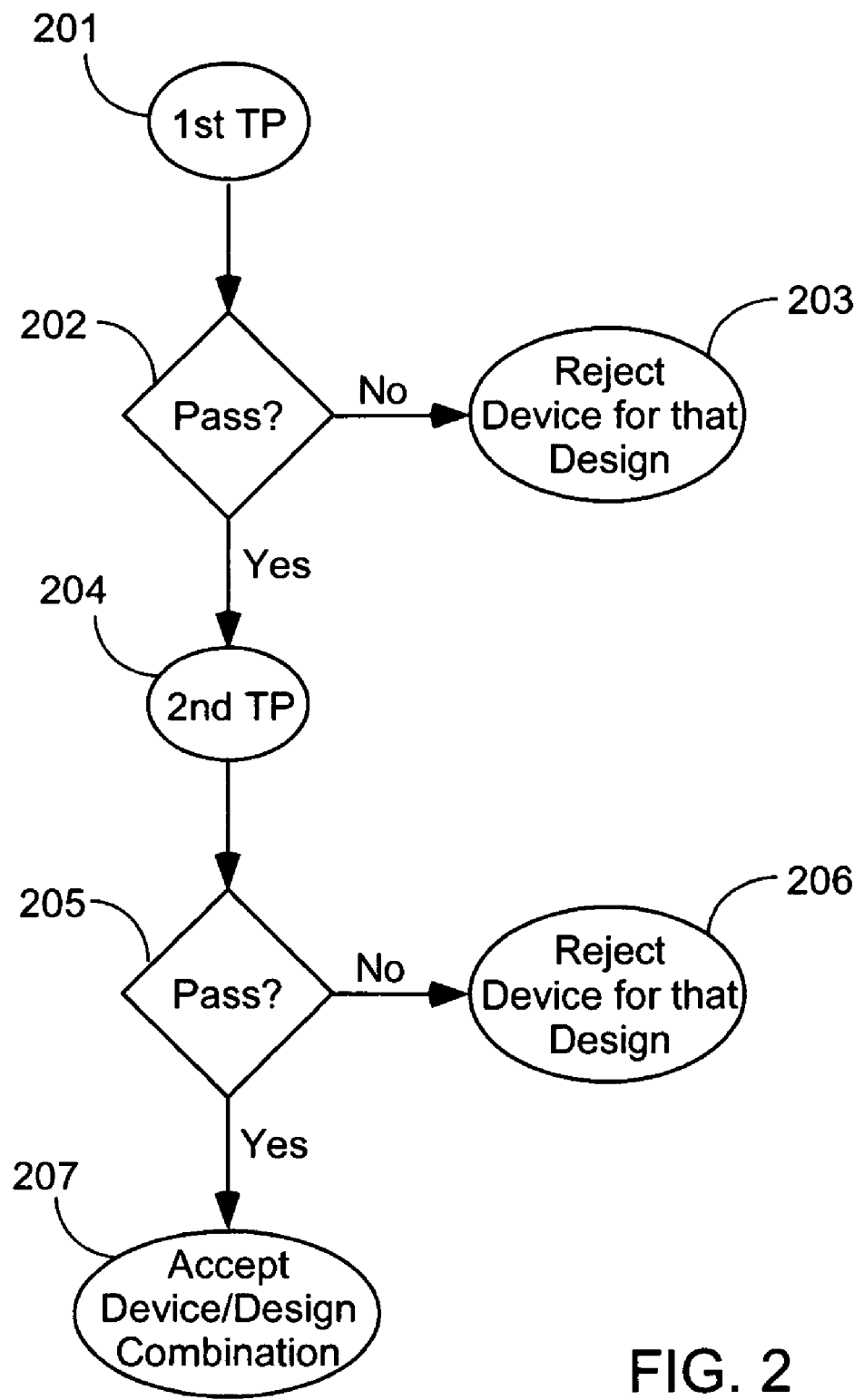
FIG. 2 shows the steps of a first known method of testing a particular user design in a specific programmable integrated circuit (IC).

FIG. 2 illustrates the steps of a known method of testing a user design in a programmable IC. In step 201, a first test pattern (TP) is run on the programmable IC. This test pattern can include, for example, loading the user design into the programmable IC, and then testing the user design by applying a series of input signals, monitoring the output from the user design, and comparing the output to an expected output. If the output does not match the expected values (decision step 202), the device/design combination is rejected (step 203). If the output does match the expected values, the testing continues using a second test pattern (step 204). Again, if the output does not match the expected values (decision step 205), the device/design combination is rejected (step 206). If the output does match the expected values, the device/design combination is accepted (step 207). Those of skill in the art of IC testing will appreciate that additional tests can be performed, as desired. FIG. 2 illustrates only two tests, for clarity, but many more tests are typically performed on a complicated user design.

Note that the configuration bitstream used in test pattern 204 might be the same as the configuration bitstream used in test pattern 201. In other words, the second test pattern can include loading a second design into the programmable IC, e.g., if different access points are required by the second test, or can simply utilize the configuration bitstream loaded into the programmable IC as part of the first test pattern.

The test design loaded into the programmable IC as part of one or both test patterns can include just the user design, but typically includes test circuitry designed to facilitate testing of the user design. For example, the test circuitry can include circuitry for bringing test stimuli into the user design from outside the device, for capturing test results output by the user design, and/or providing the test results to a tester outside the device.

Importantly, the result of the series of tests performed in FIG. 2 is that the device is accepted for that user design only if the device/design combination passes all of the tests in the series. In other words, the device/design combination is accepted if the programmable IC passes the first test pattern and also passes the second test pattern.

Figure 3:
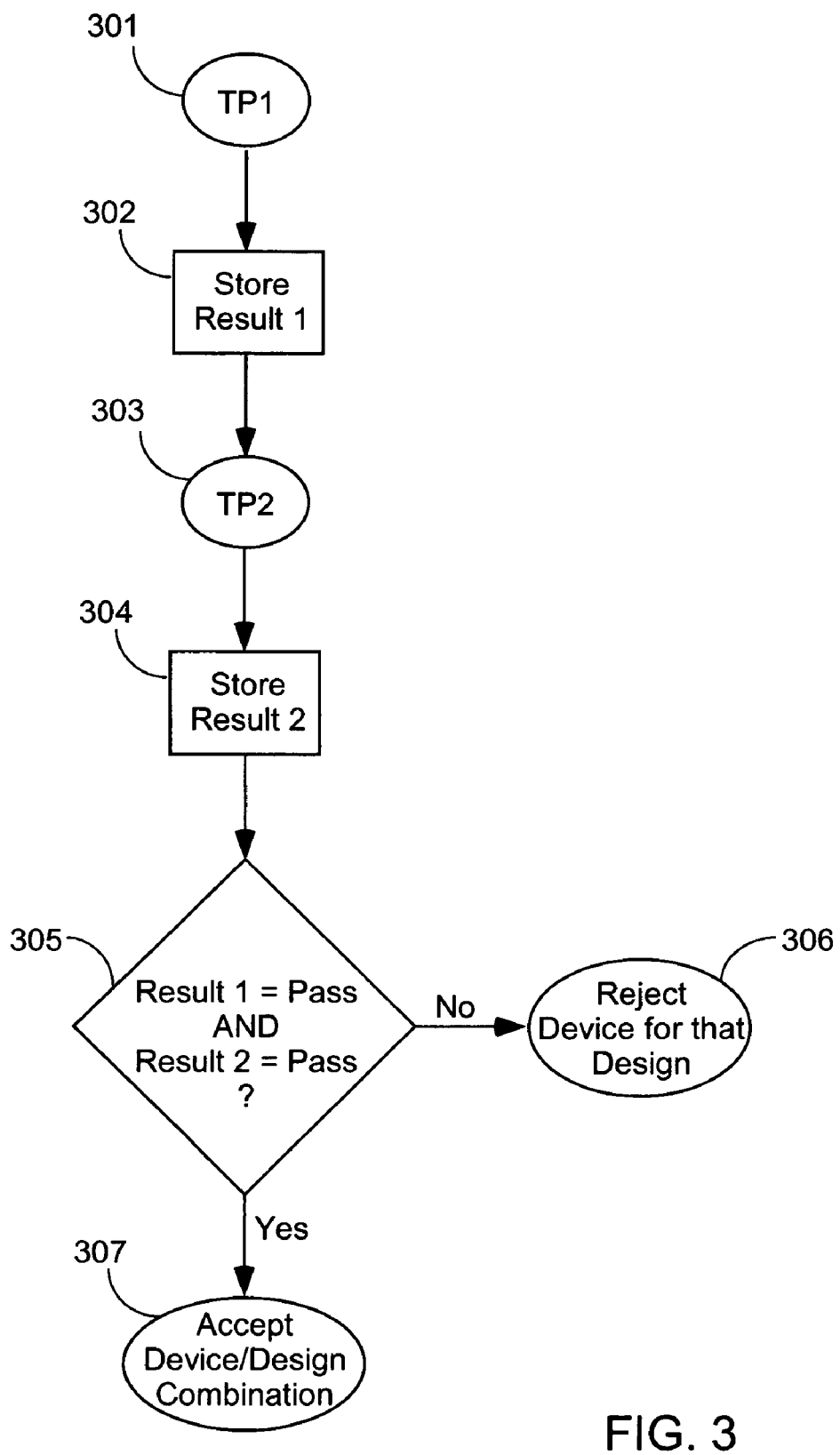
FIG. 3 shows the steps of a second known method of testing a particular user design in a specific programmable integrated circuit (IC).

FIG. 3 illustrates the steps of another known method of testing a user design in a programmable IC. After performing the first test pattern (step 301), the result of the first test pattern is stored (step 302). The second test pattern is then performed (step 303) and the result of the second test pattern is stored (step 304). In decision step 305, the results of both test patterns are utilized to determine whether or not the device/design combination has passed to overall test process. As in the embodiment of FIG. 2, both test patterns must pass in order to accept the device/design combination (step 307). If either of the two patterns has a "fail" result, the device/design combination is rejected (step 306).

Figure 4:
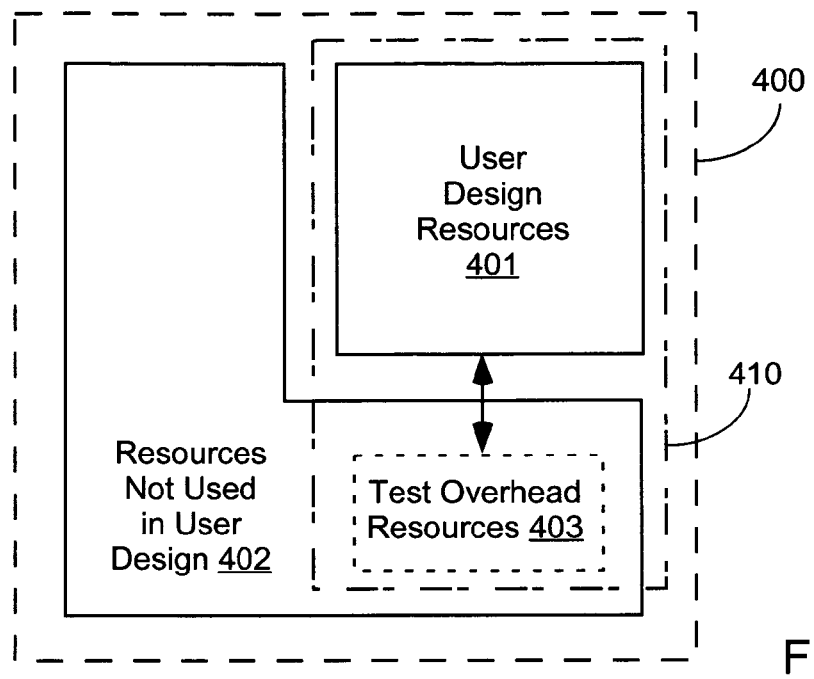
FIG. 4 is a block diagram of a programmable IC illustrating how the programmable resources of the programmable IC can be used to implement the methods of FIGS. 2 and 3.

FIG. 4 illustrates a programmable IC that can be used to implement the methods of FIGS. 2 and 3. Because the user design uses only a subset 401 of the programmable resources in the programmable IC 400, other programmable resources 402 remain available and can be used for other purposes. Some or all of these programmable resources are typically used to implement a test circuit 403. For example, the test circuit can include circuitry for bringing test stimuli into the user design from outside the device, for capturing test results output by the user design, and/or providing the test results to a tester outside the device. The programmable resources used to implement the test circuit can be referred to as "overhead" resources, because these resources add to the minimum number of programmable resources that must be available in the programmable IC in order to support the user design. In some cases, the overhead resources might require the user to purchase a larger device than would be required simply to implement the user design alone.

Note that the resources used to implement the user design and the test overhead resources might not be physically separated from one another, as shown in FIG. 4 for clarity. Instead, the two sets of resources might be overlapping or interleaved, for example. Further, the programmable resources that remain unused by either circuit can be overlapping or interleaved with one or both of these circuits.

Importantly, the series of tests shown in FIGS. 2 and 3 are performed utilizing both the user design 401 and the test overhead resources 403. Therefore, a manufacturing defect affecting a programmable resource used by either of these circuits can cause the programmable IC to fail the series of tests. Hence, a defect in any of the programmable resources in area 410 can cause the device/design combination to be rejected. If a manufacturing defect is located in the test overhead resources 403, the device/design combination may be rejected even though the design is fully functional in that particular device.

Figure 5:
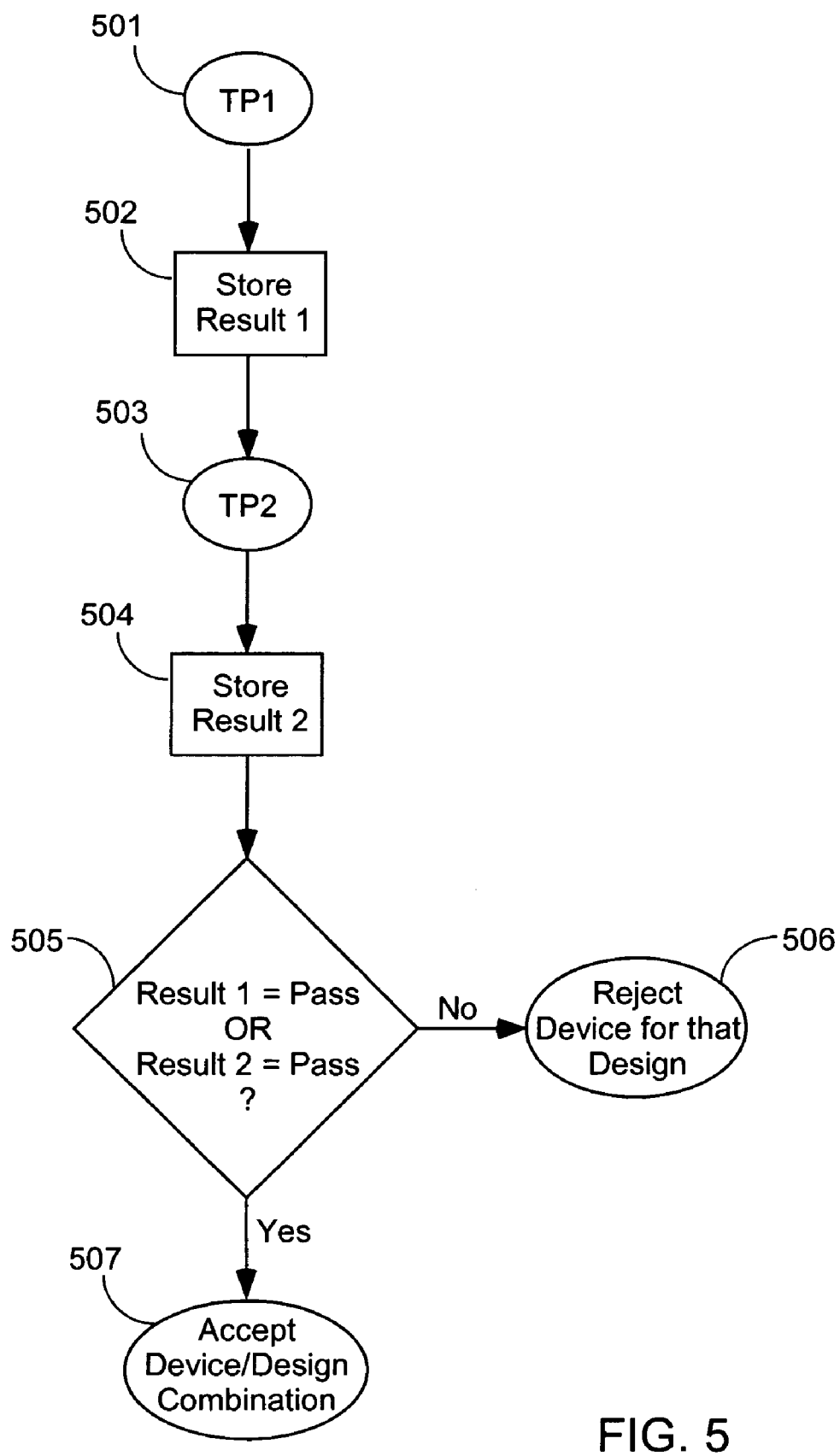
FIG. 5 shows the steps of a novel method of testing a particular user design in a specific programmable IC.

FIG. 5 illustrates the steps of an exemplary method of testing a user design in a programmable IC, according to the present invention. This novel method increases the yield of a device/design combination by ensuring that manufacturing defects in the test overhead resources do not cause the rejection of the device/design combination.

In step 501, a first test pattern (TP1) is run on the programmable IC. This test pattern includes loading a first test design (including the user design and a first test circuit) into the programmable IC and then testing the first test design, e.g., by applying a series of input signals, monitoring the output from the user design, and comparing the output to an expected output. The result of the comparison is stored in step 502. For example, if the result of the test pattern matches the expected results, a "pass" value can be stored. If the result of the test pattern does not match the expected results, a "fail" value can be stored.

In step 503, a second test pattern (TP2) is run on the programmable IC. This test pattern includes loading a second test design (including the user design and a second test circuit) into the programmable IC and then testing the second test design, e.g., by applying a series of input signals, monitoring the output from the user design, and comparing the output to an expected output. The result of the comparison is stored in step 504.

In some embodiments, the second test pattern includes reprogramming the entire programmable IC. However, some programmable ICs include the capability of "partial reconfiguration", in which part of the programmable IC can be reprogrammed while another part of the programmable IC retains the original programming and even, in some programmable ICs, continues to function during the partial reconfiguration process. Therefore, in some embodiments the second test pattern includes reprogramming the programmable IC to remove the first test circuit and to insert the second test circuit. The first and second circuits preferably include little or no overlap in their use of programmable resources.

In a preferred embodiment, the second test circuit does not use any of the same programmable resources as the first test circuit. The less duplication there is between the two test circuits, the greater the advantage of using this method, as will become clear. In some embodiments, the first and second test circuits primarily use programmable resources that are orthogonal to one another. For example, the first test circuit might include a vertically-oriented scan chain that uses vertically-oriented programmable interconnect lines to implement a majority of the interconnect. The second test circuit might include a horizontally-oriented scan chain that uses horizontally-oriented programmable interconnect lines to implement a majority of the interconnect. It will be understood that the terms "horizontal", and "vertical" as used herein are relative to one another and to the conventions followed in the figures and specification, and are not indicative of any particular orientation of or on the physical die.

In decision step 505, the results of the two test patterns are evaluated. If either of the two test patterns passes (i.e., the expected results were achieved), then the device/design combination is accepted (step 507). Only if both of the test patterns fail is the device/design combination rejected (step 506). Note that this is quite different from the prior art test sequence, in which the failure of either test pattern causes the device/design combination to be rejected.

The reason behind this change is as follows. The user design is included in both test designs. Therefore, if one of the test designs fails and the other passes, the error is not in the programmable resources used to implement the test design, but in one or the other set of test overhead resources. Because the user is going to program only the user design into the programmable IC, and does not need to include either of the test circuits, the device/design combination can still be approved if only one of the test patterns has failed.

Figure 6:
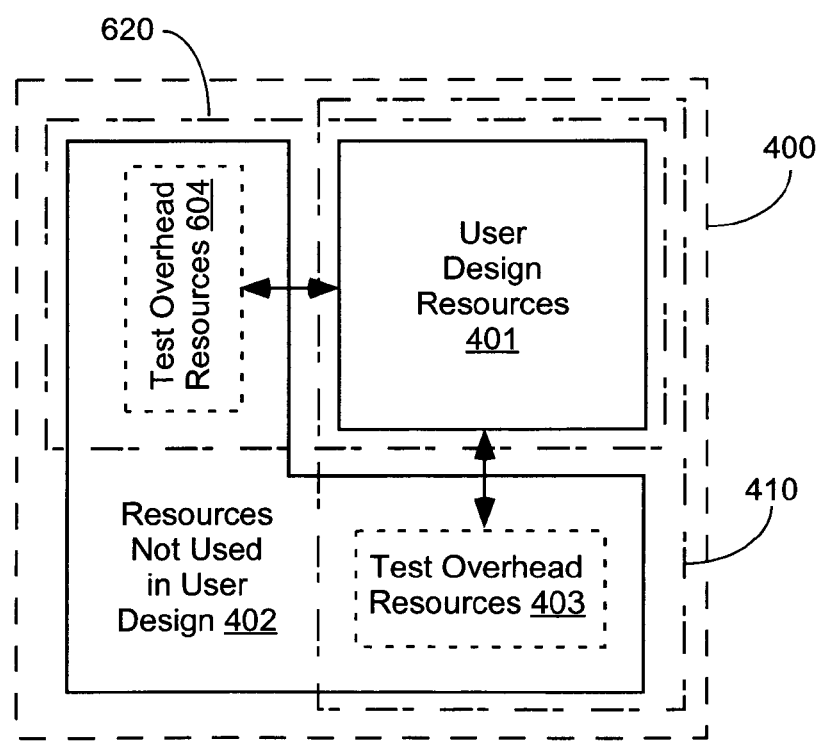
FIG. 6 is a block diagram of a programmable IC illustrating how the programmable resources of the programmable IC can be used to implement the method of FIG. 5.

FIG. 6 illustrates a programmable IC that can be used to implement the method of FIG. 5. The same programmable IC 400 can be used as in FIG. 4, with the same resources 401 being used to implement the user design, and the same resources 402 being free for other purposes. The first test pattern can use, for example, the same test circuit implemented in the same test overhead resources 403. However, a second set of resources 604 is used to implement a second test circuit for use by the second test pattern.

Note that in the pictured embodiment, the first and second sets of overhead resources (403 and 604) do not overlap. In other words, they do not use any of the same programmable resources. The advantage of this approach is that the smaller the number of resources included in both test designs (e.g., areas 410 and 620 in FIG. 6) the smaller the number of resources that can cause the rejection of the device/design combination, e.g., if disabled by a manufacturing defect. However, in some embodiments some programmable resources are included in both test circuits, i.e., the first and second test overhead resources overlap.

It will be clear to those of skill in the art that more than two test patterns can be used when following the methods of the present invention. For example, in FIG. 5, additional test patterns can be performed using test circuits that include the same user design and different test overhead resources. The results of these test patterns are stored, and in step 505 the results of all of the test patterns are evaluated. If one or more of the test patterns pass, the device/design combination is accepted.

Those having skill in the relevant arts of the invention will now perceive various modifications and additions that can be made as a result of the disclosure herein. For example, the above text describes the circuits of the invention in the context of programmable logic devices (PLDs) such as FPGAs and CPLDs. However, the circuits of the invention can also be implemented in other programmable integrated circuits. Accordingly, all such modifications and additions are deemed to be within the scope of the invention, which is to be limited only by the appended claims and their equivalents.

What is claimed is:

1. A method of testing a user design in a programmable integrated circuit (IC), the method comprising:
    programming the programmable IC to implement a first test design utilizing a first set of resources implementing the user design and a second set of resources implementing a first test circuit;
    testing the first test design in the programmable IC using a first test pattern;
    programming the programmable IC to implement a second test design utilizing the first set of resources and a third set of resources implementing a second test circuit;
    testing the second test design in the programmable IC using a second test pattern; and
    reporting a "pass" result when at least one of the first and second test patterns passes and reporting a "fail" result when both of the first and second test patterns fail.

2. The method of claim 1, wherein the second and third sets of resources comprise non-overlapping sets.

3. The method of claim 1, wherein a first one of the second and third sets of resources includes a vertically-oriented scan chain, and a second one of the second and third sets of resources includes a horizontally-oriented scan chain.

4. The method of claim 1, wherein:
    the second set of resources includes a first plurality of interconnect lines, a majority of the first plurality of interconnect lines being vertically oriented; and
    the third set of resources includes a second plurality of interconnect lines, a majority of the second plurality of interconnect lines being horizontally oriented.

5. The method of claim 1, wherein the programmable IC comprises a field programmable gate array (FPGA).

6. The method of claim 1, wherein the programmable IC comprises a fourth set of resources not included in any of the first, second, and third sets of resources.

7. A method of testing a user design in a programmable integrated circuit (IC), the method comprising:
    testing the programmable IC using a first test design, the first test design comprising the user design and a first test circuit;
    testing the programmable IC using a second test design, the second test design comprising the user design and a second test circuit different from the first test circuit; and
    reporting a "pass" result when at least one of the first and second test designs passes and reporting a "fail" result when both of the first and second test designs fail.

8. The method of claim 7, wherein the first and second test circuits comprise non-overlapping sets of resources in the programmable IC.

9. The method of claim 7, wherein a first one of the first and second test circuits includes a vertically-oriented scan chain, and a second one of the first and second test circuits includes a horizontally-oriented scan chain.

10. The method of claim 7, wherein:
    the first test circuit includes a first plurality of interconnect lines, a majority of the first plurality of interconnect lines being vertically oriented; and
    the second test circuit includes a second plurality of interconnect lines, a majority of the second plurality of interconnect lines being horizontally oriented.

11. The method of claim 7, wherein the programmable IC comprises a field programmable gate array (FPGA).

12. The method of claim 7, wherein the programmable IC comprises additional programmable resources not utilized by any of the user design, the first test circuit, and the second test circuit.

* * * * *